(12) United States Patent
Chevallier et al.

(10) Patent No.: US 10,885,972 B2
(45) Date of Patent: *Jan. 5, 2021

(54) SRAM WITH ERROR CORRECTION IN RETENTION MODE

(71) Applicant: Ambiq Micro, Inc., Austin, TX (US)

(72) Inventors: Christophe J. Chevallier, Palo Alto, CA (US); Stephen James Sheafor, Boulder, CO (US)

(73) Assignee: AMBIQ MICRO, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/833,142

(22) Filed: Mar. 27, 2020

(65) Prior Publication Data
US 2020/0227115 A1 Jul. 16, 2020

Related U.S. Application Data

(63) Continuation of application No. 16/399,261, filed on Apr. 30, 2019, now Pat. No. 10,629,257, which is a continuation of application No. 15/982,835, filed on May 17, 2018, now Pat. No. 10,319,429, which is a continuation of application No. 15/697,286, filed on Sep. 6, 2017, now Pat. No. 10,096,354.

(51) Int. Cl.
| | | |
|---|---|---|
| G11C 11/00 | (2006.01) | |
| G11C 11/412 | (2006.01) | |
| G11C 15/04 | (2006.01) | |
| G11C 11/56 | (2006.01) | |
| G11C 16/34 | (2006.01) | |
| G06F 11/10 | (2006.01) | |
| G11C 29/50 | (2006.01) | |
| G11C 11/419 | (2006.01) | |
| G11C 29/04 | (2006.01) | |

(52) U.S. Cl.
CPC ...... *G11C 11/4125* (2013.01); *G06F 11/1048* (2013.01); *G11C 11/5621* (2013.01); *G11C 15/043* (2013.01); *G11C 15/046* (2013.01); *G11C 16/3459* (2013.01); *G11C 29/50* (2013.01); *G11C 29/50016* (2013.01); *G11C 11/419* (2013.01); *G11C 2029/0411* (2013.01)

(58) Field of Classification Search
CPC ........... G11C 11/4125; G11C 11/5621; G11C 15/043; G11C 15/046; G11C 16/3459; G11C 29/20; G11C 29/50016
See application file for complete search history.

(56) References Cited

U.S. PATENT DOCUMENTS 9,001,572 B2 * 4/2015 Choi .................. G11C 11/419
365/156
10,096,354 B1 * 10/2018 Chevallier ....... G11C 29/50016
(Continued)

*Primary Examiner* — Pho M Luu
(74) *Attorney, Agent, or Firm* — David R. Stevens; Stevens Law Group

(57) ABSTRACT

A method for storing information in SRAM bit cell arrays provides for lowering voltage supplied to the SRAM bit cell arrays, with voltage lowering controlled by a connected voltage control circuit. Writing, reading, and correcting information storable in the SRAM bit cell arrays is accomplished using an error correcting code (ECC) block connected to at least some of the SRAM bit cell arrays. The ECC block is configurable to repair stored information.

20 Claims, 7 Drawing Sheets

(56) References Cited

U.S. PATENT DOCUMENTS

| | | | |
|---|---|---|---|
| 10,192,613 B2* | 1/2019 | Yamaki | G06F 3/0604 |
| 10,319,429 B2* | 6/2019 | Chevallier | G11C 29/50 |
| 10,629,257 B2* | 4/2020 | Chevallier | G11C 11/5621 |

* cited by examiner

US 10,885,972 B2

SRAM WITH ERROR CORRECTION IN RETENTION MODE

RELATED APPLICATION

This application is a continuation of U.S. Pat. No. 10,629,257, issued Apr. 21, 2020, and entitled "SRAM with Error Correction in Retention Mode", which is hereby incorporated herein by reference in its entirety for all purposes. U.S. Pat. No. 10,629,257 is a continuation of U.S. Pat. No. 10,319,429, issued Jun. 11, 2019, and entitled "SRAM with Error Correction in Retention Mode", which is hereby incorporated herein by reference in its entirety for all purposes. U.S. Pat. No. 10,319,429 is a continuation of U.S. Pat. No. 10,096,354, issued Oct. 9, 2018 and entitled SRAM with Error Correction in Retention Mode, which is hereby incorporated herein by reference in its entirety for all purposes.

FIELD OF THE INVENTION

A Static Random Access Memory (SRAM) circuit with error correction is described. Components, layouts, and methods for reducing power requirements during an SRAM retention mode are described.

BACKGROUND

SRAM circuits that store digital information are widely used in a variety of mobile and handheld devices, notably smart phones, tablets, laptops, and other consumer electronics products. Solid State memory can include stand-alone memory circuits, with a dedicated substrate, or embedded memory circuits, where the SRAM circuit shares a substrate with other electronic components. Typically, SRAM circuits consists of arrays of SRAM bit cells, and surrounding circuits such as decoders, sense amplifiers, write buffer, timers and control logic. The bit cell consists of a number of transistors. The most common SRAM cell uses six CMOS transistors connected as a latch with two pass gates. While fast and reliable, SRAM memory circuits requires substantially continuous power for operation, making efficient electrical power usage a key concern.

In recent years, due to the growth of portable electronics, there has been a push to decrease the power of the circuits used in portable electronic appliances. With a lower power, typically smaller batteries can be used. The power consumption of a circuit may be reduced by using a lower supply voltage, or by reducing the amount of internal capacitance being charged and discharged during the operation of the circuit. A memory that uses less power will be not drain a battery supply as much, and therefore a system with such memory would not need as frequent battery recharging.

In some systems, power consumption of a circuit may be reduced by using a lower supply voltage. A standard technique used in SRAM is to lower the supply voltage on the SRAM cells during a retention mode. A retention mode is a mode where the SRAM is not accessed, neither read nor written, but data is kept in the SRAM cells. There is a practical limit to how low the supply can be brought during this retention mode. If the supply is brought too low, the characteristics of the transistors in a cell may force the cell to flip state, resulting in a loss of data. In many instances most cells could function, i.e. keep their data, at this lower supply, but a few cells may fail to keep their data. However, once a regular supply is re-established, out of retention mode, these few cells would show an erroneous state.

As will be appreciated, systems and methods that could reduce or correct erroneous states would improve SRAM cell accuracy, efficacy, and could allow for reduction in overall power usage.

DETAILED DESCRIPTION

Systems and procedures for reducing data errors in SRAM memory system can be useful. This is particularly true for modern low power SRAM memory systems will large numbers of transistors, small transistor size, and low available power. Even small variations in transistor devices such as may be caused by factors such as die to die variations, within die variations, transistor level random dopant fluctuations, line edge roughness, random telegraph noise (i.e. random fluctuation in device drain current), time dependent or age degradation, gate oxide variations, channel width, and ionizing or background radiation capable of flipping bit state, can individually or in combination result in outlier SRAM cells that do not properly respond to control signals.

Figure 1:
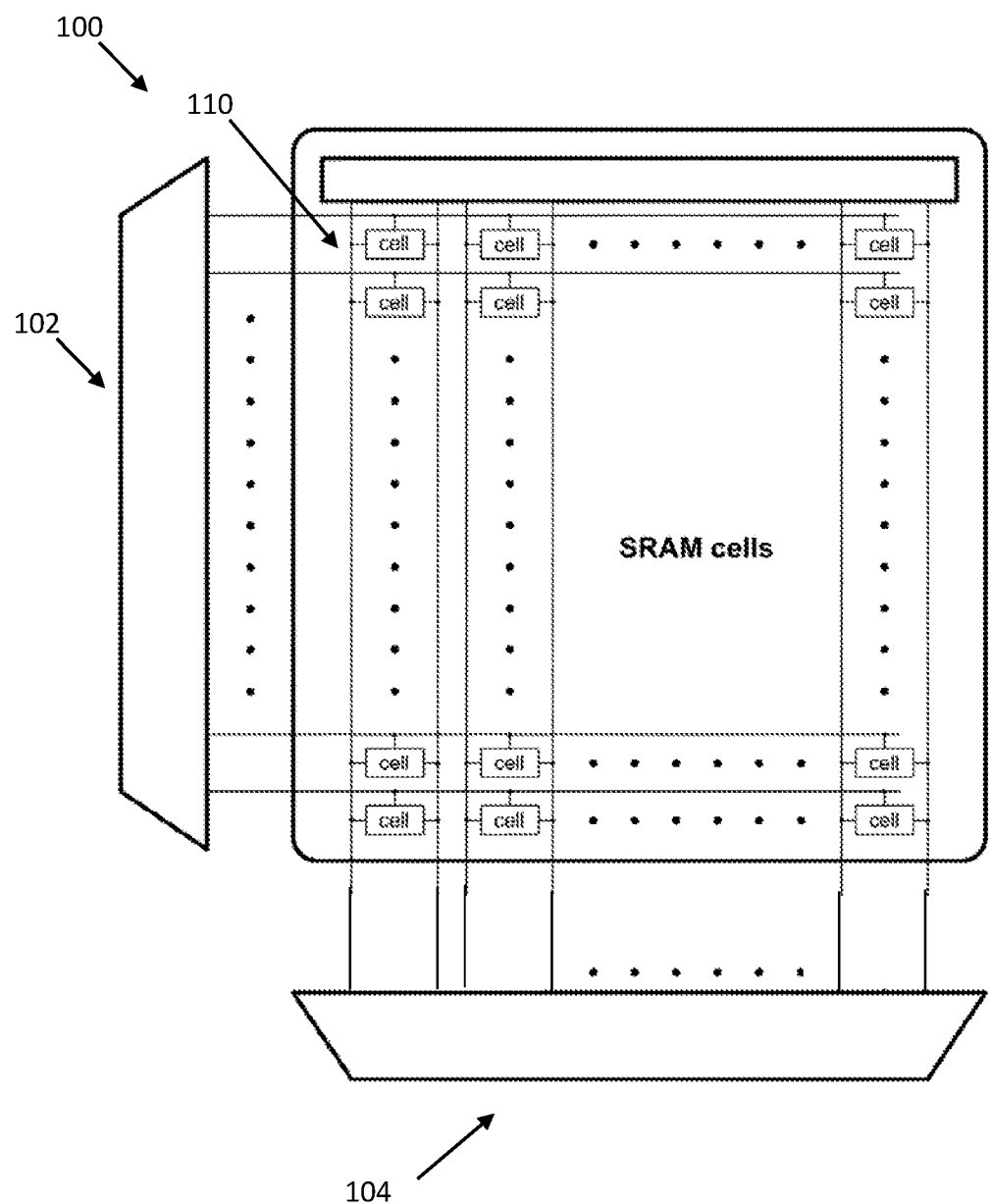
FIG. 1 schematically illustrates one example of an SRAM array configurable to support ECC capability'

While improved processing and tolerance control can reduce likeliness of some errors, not all data errors can be prevented. Fortunately, error correction and coding techniques can be used to repair some types of data errors. In operation, additional data bits incorporating information usable to reconstruct correct data are stored in a memory system. The additional data bits allow for consistency checking of data, and recovery of data that has been determined to be corrupted. Such error correcting codes (ECC) or algorithms can include, but are not limited to Hamming or Hsiao codes that provide single bit error correction and double bit error detection (SEC-DED). Other error-correction codes can include double-bit error correcting and triple-bit error detecting (DEC-TED) codes, single-nibble error correcting and double-nibble error detecting (SNC-DND) codes, or Reed-Solomon error correction codes FIG. 1 is one embodiment of an SRAM cell array system 100 with a SRAM cell array block 110 and further having peripheral circuitry capable of supporting error correction. Peripheral circuitry can include but is not limited to peripheral row circuitry 102 and peripheral column circuitry. Peripheral circuitry 102 and 104 can include multiplexors, write drivers, sense amplifiers, level shifters, voltage regulators, other power/voltage control subsystems, and error control circuitry such as will be later discussed in this disclosure.

It will be understood that both SRAM cells and peripheral circuitry of FIG. 1 can be built from various transistor types and operate in different power domains that take advantage of various transistor characteristics. For example, SRAM circuits can be built using MOS transistors. MOS transistors have a gate, a source, a drain and a bulk node. By applying a voltage on the gate the amount of current that can flow from the drain to the source can be modulated. One of the main characteristics of MOS transistors is its threshold voltage. This quantity, in its simplest definition, substantially is the voltage applied on its gate in order to pass current. With a sufficiently high supply voltage, circuitry can be build using high threshold voltage transistors. The advantage of a high threshold voltage transistor is that when its gate is turned off, the leakage from drain to source is very low, and the device consumes very little power. However, this high threshold voltage transistor cannot be used efficiently with a low supply voltage, because the signal developed in the circuitry under low supply is not high enough to let the high threshold voltage transistor pass a large amount of current, and therefore achieve proper switching speed. When proper switching speed is needed in a circuit with a low supply, low threshold voltage transistors can be used. In some embodiments, SRAM cells can be built with high threshold voltage transistors, while the peripheral circuitry, operating in one or more distinct power domains, is built with low threshold voltage transistors.

As discussed with respect to U.S. patent application Ser. No. 15/412,039, titled "SRAM with Active Bias", filed Jan. 22, 2017, the disclosure of which is herein incorporated in its entirety by reference; arrays of SRAM cells can be operated in different modes. Exemplary modes may include, without limitation: (i) an active mode during which write and read operations are performed; (ii) a standby mode where the SRAM circuit is idle, but can quickly switch back into active modes; (iii) a retention mode where the voltage supply for the SRAM array, including the SRAM cells, is reduced, providing for lower power consumption by the SRAM array while maintaining the data content stored in the SRAM array; and (iv) a power down mode where the majority of the circuitry inside the SRAM facility is powered down, and the data stored in the SRAM array is lost.

In some embodiments, the voltage supply of the SRAM cells in retention mode can be lowered to reduce the overall voltage across the transistors of the SRAM cells with a concomitant reduction in power dissipation. Advantageously, the lower the voltage, the less power is consumed. In systems which are left idle, i.e. without activity, for long period of times, the memory can be left in retention mode and consumes very little power while preserving data. A memory that uses less power will be not drain a battery supply as much, and therefore a system with such memory would not need as frequent battery recharging.

An alternative practice in a retention mode is to raise the ground supply of the SRAM cells in the SRAM array, again, to reduce the overall voltage across the transistors of the SRAM cells. However, the reduction in voltage across the transistors of the SRAM cells, either by lowering the supply voltage or raising the ground supply, is limited by the threshold voltages of the transistors in each cell. Once the voltage across the transistors of the SRAM cells nears the threshold voltage of the transistors of the SRAM cells, the SRAM cell's ability to maintain its proper state is compromised.

According to one embodiment, data integrity may be maintained by lowering the threshold voltages of selected transistors. Various permutations of the embodiment are anticipated. For example, an SRAM facility could have two modes of retention. A first mode may be a mode where the well and substrate of SRAM cell transistors are biased at (respectively) power supply and ground level. In this mode, the well supply or well node and the source or drain of the PMOS transistor are both coupled to the power supply and the substrate supply or substrate node and the source or drain of the NMOS transistor are both coupled to the ground supply. A second mode may be a mode where the well and substrate of the SRAM cell transistors are biased at lower well voltage and higher substrate voltage. In this second mode, the well supply or well node is supplied at a lower, i.e., different, voltage than the source or drain of the PMOS transistor and the substrate supply or substrate node is supplied at a higher, i.e., different, voltage than the source or drain of the NMOS transistor.

In operation, bias levels can be determined by testing to determine its functionality for retention at low voltage. As an example, a retention test (write pattern, lower array supply to retention voltage, wait a certain amount of time (typically in order of milliseconds), raise array supply to nominal voltage, read and compare pattern) is applied with varying retention voltages. The results of such a test can be stored in a register. During, for example, retention mode, the information from the register is used to bias the SRAM cell transistors to the minimum passing retention level. In one embodiment, the retention test can be performed once during an initial test phase, and the result of the test can be stored permanently on the integrated circuits, for example in non-volatile memory cells. Alternatively, the test may be performed each time the SRAM cell transistors are powered up, or at regular intervals. Additionally, in some embodiments the techniques described herein may be further enhanced by using a temperature detector to provide information useful for bias level selection.

Figure 2:
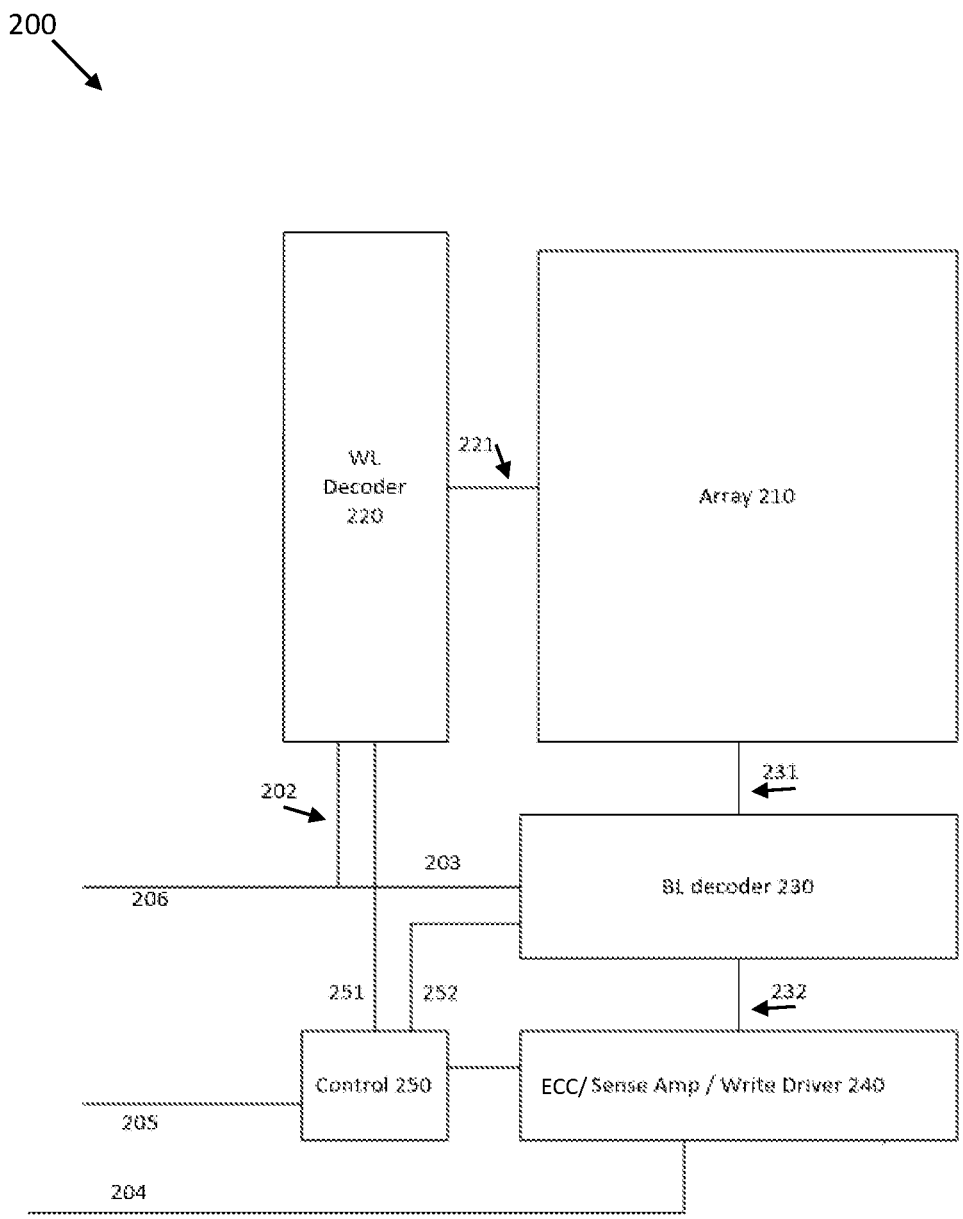
FIG. 2 illustrates a block diagram of an SRAM circuit.

FIG. 2 illustrates in more detail some peripheral circuitry that includes error correction capability. As seen in FIG. 2, a SRAM circuit 200 forms a part of an SRAM array system having an adjustable power supply such as disclosed with respect to FIG. 1. Three signal busses 206, 205 and 204 respectively carry address, control and data signal between other electronic circuits, blocks, or components of SRAM circuit 200. These circuits can be on a common semiconductor die, or provided as separate packaged components that are interconnected on a printed circuit board or other suitable substrate.

The address bus 206 splits into bus 202 and 203, to decode which word line "WL" 221 and which bit lines ("BL") 231 are decoded for a given address signal.

The control bus 205 will set whether the SRAM circuit performs a read operation, a write operation or remains idle.

The data bus 204 carries the data between the outside environment and block circuitry 240 that includes error correcting circuitry, sense amplifiers, and write drivers. It can either includes input lines and output lines or be multiplexed as IO lines.

Signal 232 carries data between block 240 and BL decoder 230. The selected signals 231 (BLs) and 221 (WL) enable the selection of the SRAM cells inside array 210 that correspond to the applied address. Collectively, signals 206, 202, 203 and block 220 represent the address path.

Signals 204, 232, 231, and decoder 230 represent the data path.

To improve overall power efficiency for the SRAM and associated circuits, various circuit blocks can be connected to separate power lines having a distinct voltage. For example, block 240 and BL decoder 230 of the data path can be powered at a first voltage, while block 220 of the address path is supplied with power at a second voltage.

In a retention mode, the adjustable power supply of the SRAM cell is lowered, or the ground supply of the SRAM cell is brought up to limit the overall voltage across the transistors of the SRAM cell. However, the reduction in supply voltage (power or ground supply) is limited by the threshold voltages of the transistors in each cell. Once the SRAM cell supply is near the threshold voltage value of the transistors in the SRAM cell, the SRAM cell ability to maintain its proper state is compromised. Notably, data errors due to this problem can be at least partially compensated by error correction circuitry in block 240. In other embodiments, wherein the SRAM circuit 200 is partitioned into multiple cells, some cells can be connected to support ECC while other cells do not support ECC. For example, in those embodiments having two or more modes of retention, a first retention mode can use ECC to correct for cell, and a second retention mode, typically having a higher retention voltage, can be used for cells without ECC.

Figure 3:
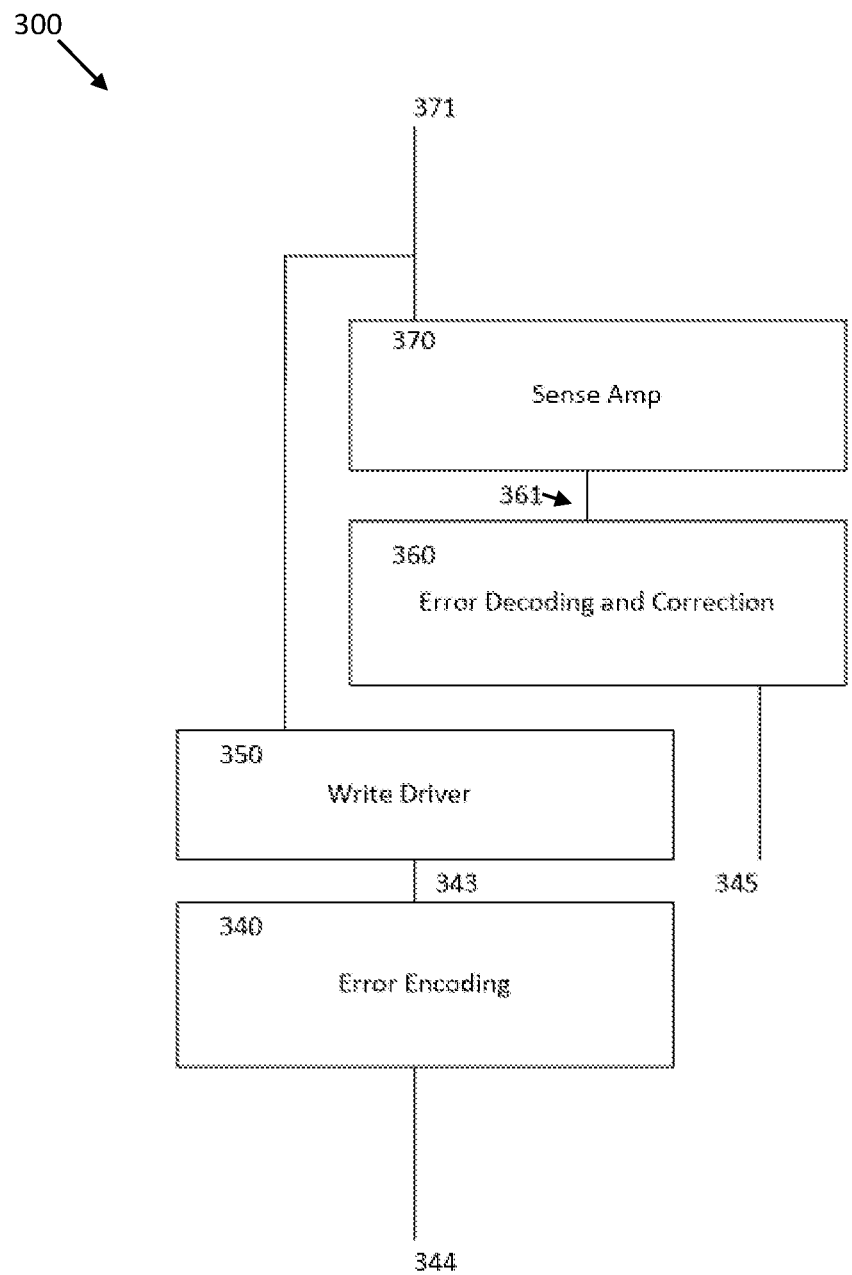
FIG. 3 illustrates a block diagram of the sensing and writing blocks including ECC circuitry.

FIG. 3 illustrates a block diagram of error correction (ECC), sensing, and writing blocks of system 300 and corresponding to circuitry block 240 of FIG. 2. As illustrated, data line 344 transfers data and additional error encoding information and processing is provided by block 340. This information is transferred via line 343 to write driver 350, which prepares, orders, and transfers data to an SRAM array (not shown) via line 371. The read process transfers charge information from the SRAM array via line 371 to sense amplifier 370. The sense amplifier converts the charge information to a data bitstream transferred via line 361 to error decoding and correction (ECC) block 360. The data is examined for corruption or loss, and if possible, algorithms are applied to repair the data to its originally written form. The corrected data, or a suitable error sequence or message is transferred via line 345 for further processing.

Figure 4:
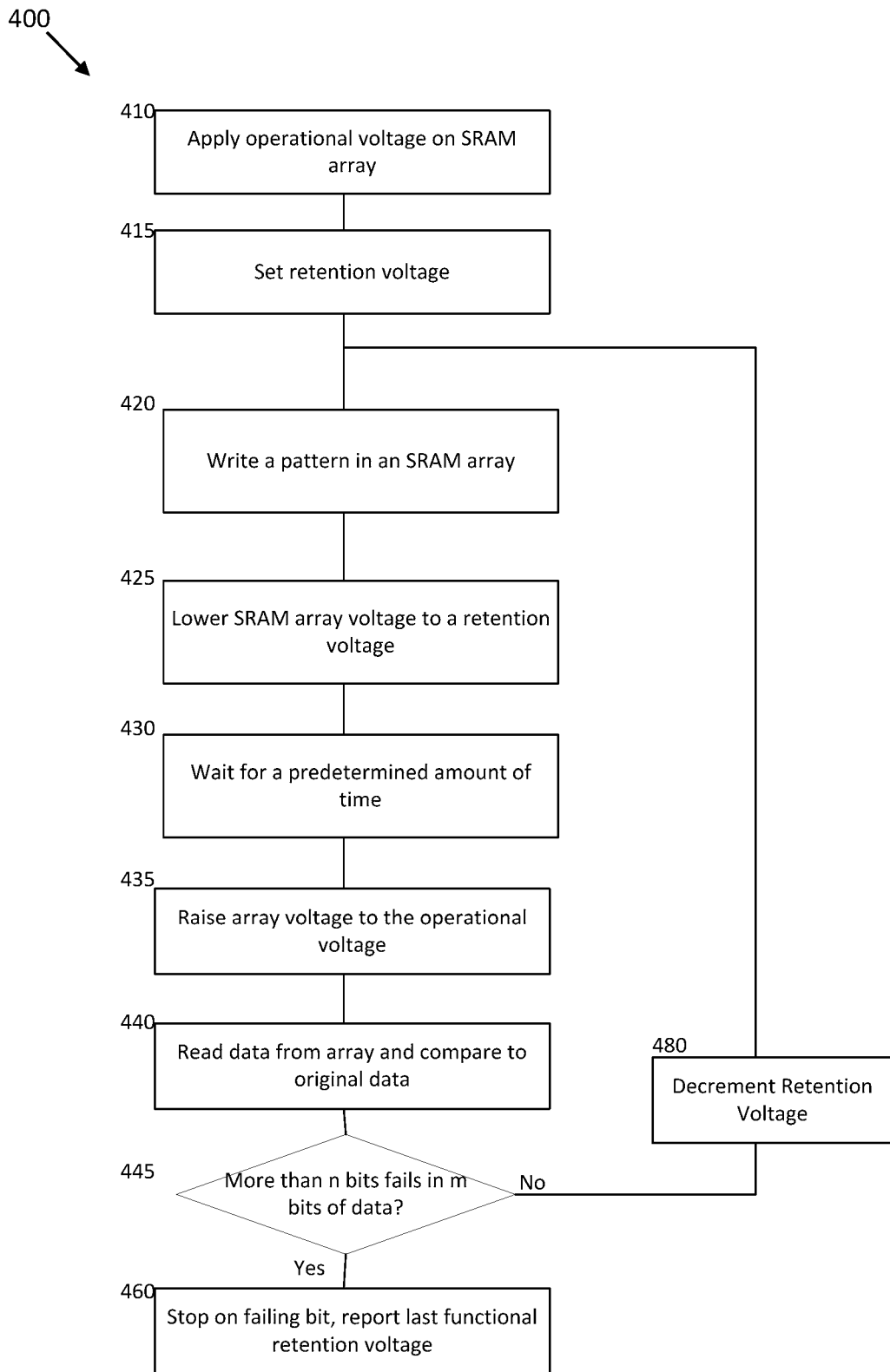
FIG. 4 illustrates one sequence of steps for determining the minimum retention voltage in an SRAM circuit having ECC capability.

FIG. 4 illustrates one sequence of steps 400 for determining the minimum retention voltage in an SRAM circuit having ECC capability. An operational test to determine an appropriate retention voltage can be performed each time the SRAM cell transistors are powered up, or at regular intervals. Alternatively, the test may be performed at manufacture. A nonvolatile memory or register can be used to store test result(s). In step 410, an operational voltage is applied to the SRAM array. In step 415, the retention voltage is set. In step 420 a pattern is written to the SRAM array, followed in step 425 by lowering the SRAM voltage to the previously set retention voltage (from step 415). After waiting for a predetermined time in a step 430, the array voltage is raised to an operation voltage in step 435. The patterned data is read from the array and compared to the original data in step 440. In step 445 finding is made as to whether more than some n bits fail in m bits of data. If they do not, the retention voltage is decremented in a step 480 and a new data pattern is tested. This is repeated until step 445 has more than some n bits fail in m bits of data. At this point, step 460 occurs with a stop on the failing test, and the last reported functional retention voltage is used. In one embodiment, a first number of data bits is 39 and the second number of bit fails is 1.

To properly check all bits this flow has to be checked with enough patterns to check all bits as "1" and as "0", including for the ECC code bits. Patterns have been developed in the industry that allow all bits, data and ECC bits, to be checked as "1" and "0".

A further step, not shown, can be performed by the tester to ensure that this flow detects multiple fails at the same address, coming from different patterns. The tester has to log the address of the failures for all tested patterns and compute the resulting failure map, and then reject as a "no" in step 445 more than n bits total fail form bits of data.

Advantageously, this sequence of steps generally allows for a lower retention voltage, and consequent improved power usage, as compared to other alternatives in which decrement of retention voltage is halted after a single bit failure. Improvements in ECC circuitry or algorithms can be used to further reduce retention voltage.

Figure 5:
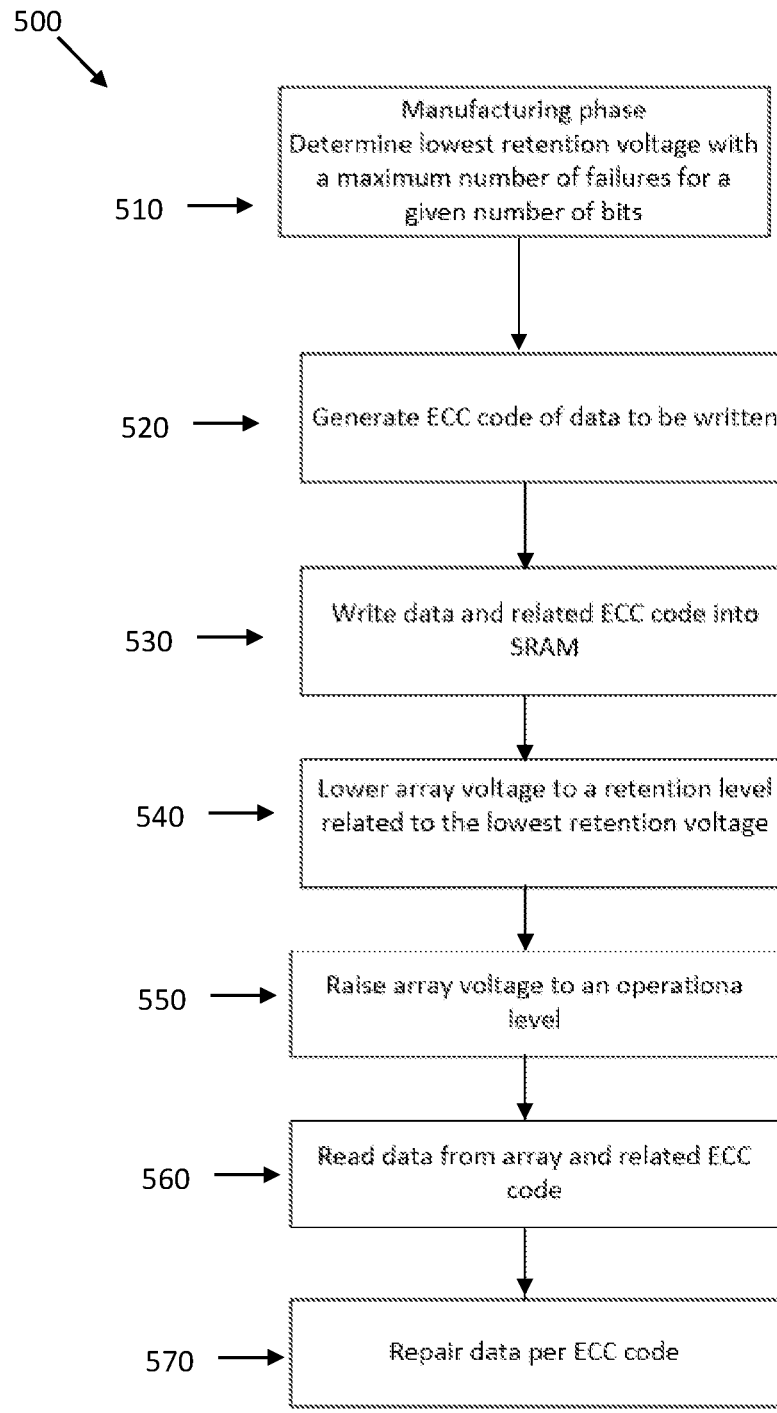
FIG. 5 illustrates a sequence of steps for using a retention mode in an SRAM with ECC.

FIG. 5 illustrates a sequence of steps 500 for using a retention mode in an SRAM array system. In step 510, a manufacturing phase step, the lowest retention voltage with a maximum number of failures for a given number of bits is determined, using techniques similar to that discussed with reference to FIG. 4. In step 520, ECC code of data to be written is generated. In step 530, data and related ECC code is written into the SRAM array. In step 540, array voltage is lowered to a retention level related to the lowest previously determined retention voltage. At that stage, the SRAM array is in retention mode and its power consumption while maintaining data integrity is minimum. In step 550, the SRAM array voltage is raised to an operational level, followed in step 560 by a data read from the SRAM array, including the related ECC code. The data is checked, and if necessary, repaired using the ECC code in step 570.

In some embodiments, the retention voltage can set to a level ensuring loss of at least some SRAM bits in SRAM words retained in the SRAM array blocks. Since ECC circuitry can correct these errors, there can be an overall power savings due to the lower retention voltage. Alternatively, the retention voltage can be set to a level ensuring retention of all SRAM bits in SRAM words retained in selected SRAM array blocks, while using lower retention voltage in other SRAM array blocks.

Figure 6:
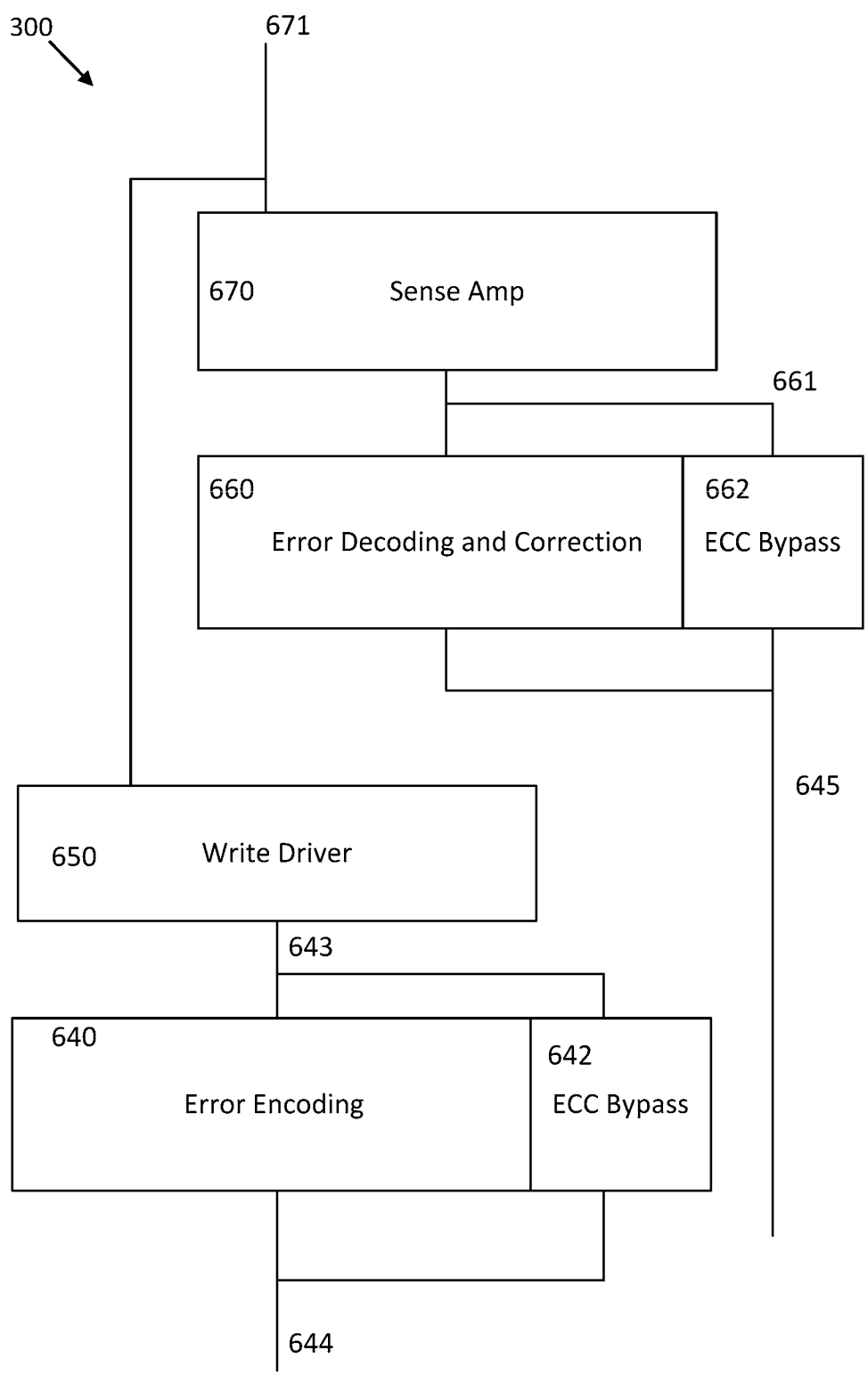
FIG. 6 is another embodiment illustrating a block diagram of the sensing and writing blocks including ECC circuitry.

FIG. 6 is another embodiment illustrating a block diagram of error correction (ECC), sensing, and writing blocks of a system 600 corresponding to another embodiment of circuitry block 240 of FIG. 2. As illustrated, data line 644 transfers data and additional error encoding information, with processing provided by block 340, and with addition of a block 642, which provides for a bypass of the error encoding information block. When the ECC Bypass is selected in response to a control signal (not shown), data from 644 will directly transfer to 643. Additional control signals and muxes (not shown) can be added to direct data from 644 toward the SRAM data area or the SRAM ECC area. This information is transferred via line 643 to write driver 650, which prepares, orders, and transfers data to an SRAM array (not shown) via line 671. The read process transfers charge information from the SRAM array via line 671 to sense amplifier 670. The sense amplifier converts the charge information to a data bitstream transferred via line 661 to error decoding and correction (ECC) block 360. The data is examined for corruption or loss, and if possible, algorithms are applied to repair the data to its originally written form. The corrected data, or a suitable error sequence or message is transferred via line 645 for further processing.

Figure 7:
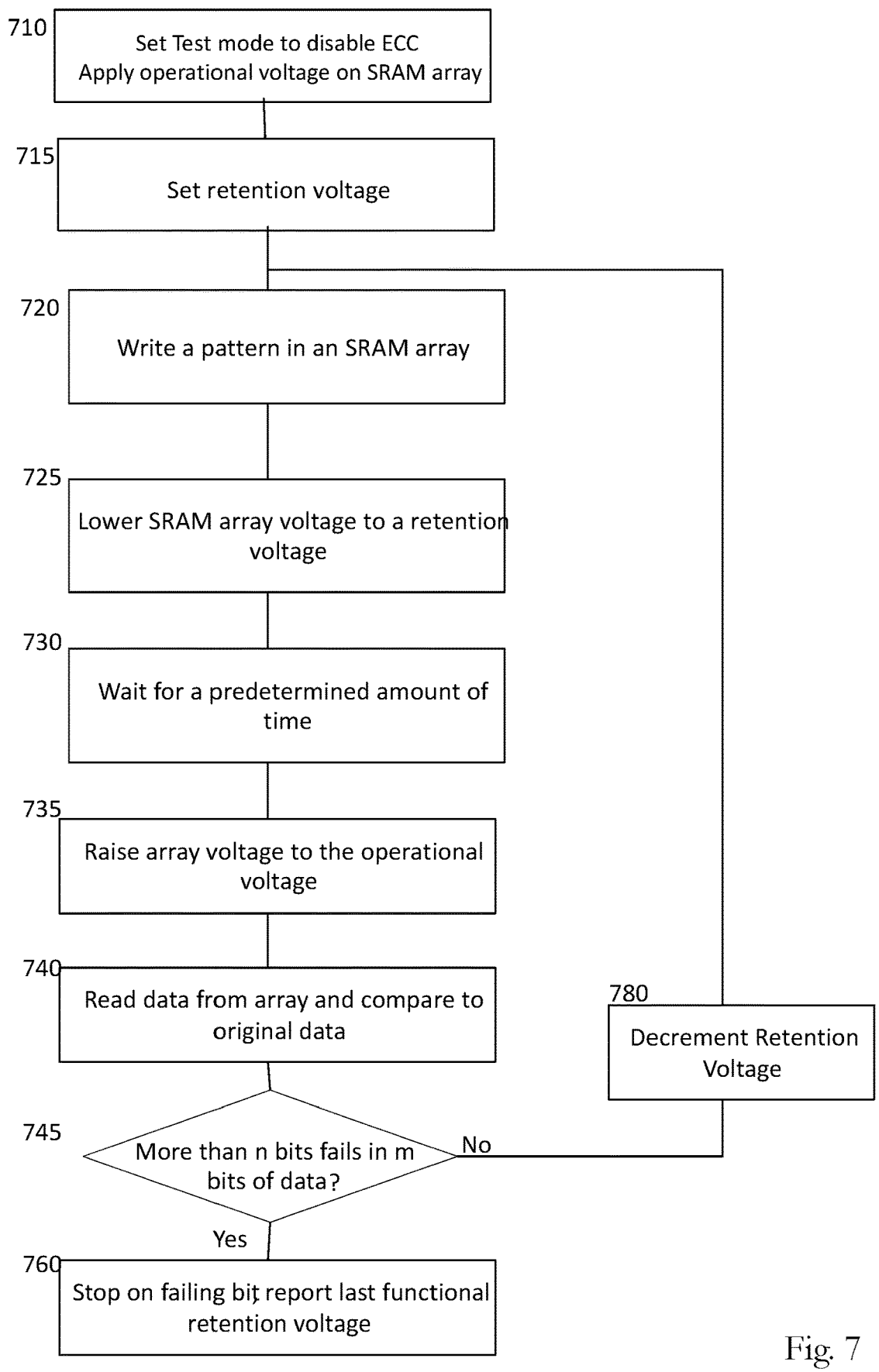
FIG. 7 is another embodiment illustrating a sequence of steps for using a retention mode in an SRAM with ECC.

FIG. 7 illustrates one sequence of steps 700 for determining the minimum retention voltage in an SRAM circuit having ECC capability. An operational test to determine an appropriate retention voltage can be performed each time the SRAM cell transistors are powered up, or at regular intervals. Alternatively, the test may be performed at manufacture. A nonvolatile memory or register can be used to store test result(s). In step 710, a test mode is selected to use the ECC bypass as shown in FIG. 6, and an operational voltage is applied to the SRAM array. In step 715, the retention voltage is set. In step 720 a pattern is written to the SRAM array, followed in step 725 by lowering the SRAM voltage to the previously set retention voltage (from step 715). After waiting for a predetermined time in a step 730, the array voltage is raised to an operation voltage in step 735. The patterned data is read from the array and compared to the original data in step 740. In step 745 finding is made as to whether more than some n bits fail in m bits of data. If they do not, the retention voltage is decremented in a step 780 and a new data pattern is tested. This is repeated until step 745 has more than some n bits fail in m bits of data. At this point, step 760 occurs with a stop on the failing test, and the last reported functional retention voltage is used. In one embodiment, a first number of data bits is 39 and the second number of bit fails is 1.

In order to test all bits in the SRAM arrays, 2 patterns, one inverse from the other, have to be sent to each address, to ensure that both "0" failures and "1" failures are detected. In order to test all bits in the SRAM array, the patterns have to address both data bits and ECC bits. This can either be done by creating a larger bus from the write driver and sense amp to the tester ports, or by using a control signal to select either the data areas in the array or the ECC areas in the array.

A further step, not shown, can be performed by the tester to ensure that this flow detects multiple fails at the same address, coming from different patterns. The tester has to log the address of the failures for all tested patterns and compute the resulting failure map, and then reject as a "no" in step 745 more than n bits total fail form bits of data.

In the foregoing description, reference is made to the accompanying drawings that form a part thereof, and in which is shown by way of illustration specific exemplary embodiments in which the disclosure may be practiced. These embodiments are described in sufficient detail to enable those skilled in the art to practice the concepts disclosed herein.

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

In general, in this disclosure the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive Boolean states may be referred to as logic_0 and logic_1. Consistent system operation can be obtained by reversing the logic sense of all such signals, such that signals described herein as logically true become logically false and vice versa. Furthermore, it is of no relevance in such systems which specific voltage levels are selected to represent each of the logic states.

Reference to a facility or a system can mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities.

Embodiments in accordance with the present disclosure may be embodied in whole or in part as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. An apparatus comprising: a SRAM array with an adjustable power supply and peripheral circuitry including an error correction code (ECC) circuit configured to perform error code correction and a bypass circuit configured to bypass the ECC circuit; and a controller coupled to the SRAM array and the peripheral circuitry, the controller programmed to: operate in a first mode in which the controller is programmed to read data from SRAM array using the bypass circuit; and operate in a second mode in which the controller is programmed to read data from the SRAM array using the ECC circuit.

2. The apparatus of claim 1, wherein the controller is further programmed to, when in the first mode, performing a test method including: (a) writing first data to the SRAM array; (b) following (a), changing a voltage supplied to the SRAM array to a test voltage; (c) following (b), reversing the changing of the voltage supplied to the SRAM array; (d) following (c), reading the first data from the SRAM array using the bypass circuit; (f) if a number of errors in the first data as read at (d) meets a threshold condition, changing the test voltage and repeating the test method starting at (a); and (g) if the number of errors in the first data as read at (d) does not meet the threshold condition, setting a retention voltage to be the test voltage from a preceding iteration of the test method.

3. The apparatus of claim 2, wherein the controller is further programmed to, when in the first mode: store a value representing the retention voltage in a register.

4. The apparatus of claim 3, wherein the controller is further programmed to, when in the second mode: (h) write second data to the SRAM array; (i) following (h), change the voltage supplied to the SRAM array according to the value stored in the register; (j) following (i), reverse the change to the voltage supplied to the SRAM array at (i); and (k) following (j), read the second data from the SRAM array using the ECC circuit.

5. The apparatus of claim 4, wherein changing the voltage supplied to the SRAM array according to the value stored in the register comprises lowering a well voltage applied to wells of complementary metal oxide semiconductor (CMOS) transistors of the SRAM array.

6. The apparatus of claim 5, wherein changing the voltage supplied to the SRAM array according to the value stored in the register further comprises increasing a substrate voltage applied to substrates of the CMOS transistors of the SRAM array.

7. The apparatus of claim 2, wherein the threshold condition is more than n out of m bits lost, where n and m are predetermined integers.

8. The apparatus of claim 7, wherein the controller is further programmed to: detect multiple errors at a same bit location of the SRAM array; and at (d), exclude lost bits at the same bit location from a calculation of a number of bits lost.

9. The apparatus of claim 2, wherein the test method further includes waiting for a delay period between (b) and (c).

10. The apparatus of claim 9, wherein the delay period is one or more milliseconds.

11. An method comprising: providing a SRAM array with an adjustable power supply and peripheral circuitry including an error correction code (ECC) circuit configured to perform error code correction and a bypass circuit configured to bypass the ECC circuit; providing a controller coupled to the SRAM array and the peripheral circuitry; operating the SRAM array, by the controller, in a first mode in which data is read from SRAM array using the bypass circuit; and operating the SRAM array, by the controller, in a second mode in which data is read from SRAM array using the ECC circuit.

12. The method of claim 11, wherein operating the SRAM array in the first mode comprises iteratively performing a test routine, the test routine comprising: (a) writing first data to the SRAM array; (b) following (a), changing a voltage supplied to the SRAM array to a test voltage; (c) following (b), reversing the changing of the voltage supplied to the SRAM array at (b); (d) following (c), reading the first data from the SRAM array using the bypass circuit; (f) when a number of errors in the first data as read at (d) meets a threshold condition, changing the test voltage and repeating the test routine starting at (a); and (g) when the number of errors in the first data as read at (d) does not meet the threshold condition, setting a retention voltage to be the test voltage from a preceding iteration of the test routine.

13. The method of claim 12, further comprising storing a value representing the retention voltage in a register.

14. The method of claim 13, wherein operating the SRAM array in the second mode comprises: (h) writing second data to the SRAM array; (i) following (h), changing the voltage supplied to the SRAM array according to the value stored in the register; (j) following (i), reversing the changing of the voltage supplied to the SRAM array at (i); and (k) following (j), reading the second data from the SRAM array using the ECC circuit.

15. The method of claim 14, wherein changing the voltage supplied to the SRAM array according to the value stored in the register comprises lowering a well voltage applied to wells of complementary metal oxide semiconductor (CMOS) transistors of the SRAM array.

16. The method of claim 15, wherein changing the voltage supplied to the SRAM array according to the value stored in the register further comprises increasing a substrate voltage applied to substrates of the CMOS transistors of the SRAM array.

17. The method of claim 12, wherein the threshold condition is more than n out of m bits lost, where n and m are predetermined integers.

18. The method of claim 17, wherein the test routine further comprises: detecting multiple errors at a same bit location of the SRAM array; and at (d), exclude lost bits at the same bit location from a calculation of a number of bits lost.

19. The method of claim 12, wherein the test routine further includes waiting for a delay period between (b) and (c).

20. The method of claim 19, wherein the delay period is one or more milliseconds.

* * * * *